(12) United States Patent
Harada et al.

(10) Patent No.: US 9,316,902 B2
(45) Date of Patent: Apr. 19, 2016

(54) PHOTOMASK-FORMING GLASS SUBSTRATE AND MAKING METHOD

(71) Applicant: SHIN-ETSU CHEMICAL CO., LTD., Tokyo (JP)

(72) Inventors: Daijitsu Harada, Joetsu (JP); Mamoru Morikawa, Joetsu (JP); Masaki Takeuchi, Joetsu (JP); Yukio Shibano, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 103 days.

(21) Appl. No.: 14/020,454

(22) Filed: Sep. 6, 2013

(65) Prior Publication Data

US 2014/0004309 A1    Jan. 2, 2014

Related U.S. Application Data

(62) Division of application No. 12/964,762, filed on Dec. 10, 2010, now Pat. No. 8,551,346.

(30) Foreign Application Priority Data

Dec. 11, 2009    (JP) ................................. 2009-281698

(51) Int. Cl.
   *G03F 1/60* (2012.01)
   *G03F 1/00* (2012.01)

(52) U.S. Cl.
   CPC .. *G03F 1/60* (2013.01); *G03F 1/14* (2013.01); *Y10T 428/24488* (2015.01)

(58) Field of Classification Search
   CPC ............... G03F 1/00; G03F 1/14; G03F 1/60; G02B 2006/12038
   USPC ................................................ 430/5; 428/432
   See application file for complete search history.

(56) References Cited

U.S. PATENT DOCUMENTS

| | | | |
|---|---|---|---|
| 7,435,609 B2 | 10/2008 | Itoh | |
| 7,455,785 B2 | 11/2008 | Koike et al. | |
| 7,579,120 B2 | 8/2009 | Akagawa | |
| 2005/0019677 A1 | 1/2005 | Nakatsu et al. | |

(Continued)

FOREIGN PATENT DOCUMENTS

| | | |
|---|---|---|
| JP | 2003-50458 A | 2/2003 |
| JP | 2004-29735 A | 1/2004 |
| WO | WO 2004/083961 A1 | 9/2004 |

OTHER PUBLICATIONS

Extended European Search Report issued Feb. 24, 2012, in European Patent Application No. 10252063.2.

(Continued)

*Primary Examiner* — Stephen Rosasco
(74) *Attorney, Agent, or Firm* — Birch, Stewart, Kolasch & Birch, LLP

(57) ABSTRACT

A photomask-forming glass substrate having a square major surface is provided wherein two strip regions are defined on the major surface near a pair of opposed sides such that each region spans between 2 mm and 10 mm inward of the side and excludes end portions extending 2 mm inward from the opposed ends of the side, a least squares plane is computed for each of the two strip regions, the angle included between normal lines to the least squares planes of two strip regions is within 10 seconds, and the height difference between two strip regions is up to 0.5 μm.

4 Claims, 4 Drawing Sheets

(56) References Cited

U.S. PATENT DOCUMENTS

2005/0020083 A1 1/2005 Numanami et al.
2006/0068300 A1 3/2006 Tanabe et al.
2006/0223224 A1 10/2006 Akagawa

OTHER PUBLICATIONS

Grant, Roger and Claire, Grant & Hackh's Chemical Dictionary, Fifth Edition, 1987, McGraw-Hill, Inc., pp. 261 and 487.

PHOTOMASK-FORMING GLASS SUBSTRATE AND MAKING METHOD

CROSS-REFERENCE TO RELATED APPLICATION

This application is a Divisional of copending application Ser. No. 12/964,762 filed on Dec. 10, 2010, which claims priority to Application No. 2009-281698 filed in Japan, on Dec. 11, 2009. The entire contents of all of the above applications is hereby incorporated by reference.

TECHNICAL FIELD

This invention relates to glass substrates for forming photomasks used in the manufacture of semiconductor-related electronic materials in the advanced applications, and a method for preparing the same.

BACKGROUND ART

In unison with the continuous advance toward higher integration of semiconductor devices, the photolithography process encounters an increasing demand for further miniaturization. With respect to the flatness of silica glass substrates for forming photomasks, even a photomask using a substrate having a satisfactory value of flatness has a likelihood that when mounted in an exposure tool by a vacuum chuck or holding means, the overall surface topography (or shape) of the photomask may be substantially deformed depending on the surface topography of portions of the substrate corresponding to the holding means of the exposure tool.

A photomask is generally prepared by depositing a light-shielding film on a silica glass substrate and patterning the film. Upon lithographic exposure, the photomask is often held horizontal by chucking the photomask surface at its outer peripheral portions by a vacuum chuck or holding means. The overall surface topography of the photomask may be substantially deformed depending on the surface topography of portions of the substrate corresponding to the holding means of the exposure tool. For this reason, attempts were made to select a substrate having minimal deformation and to bevel a substrate near chamfered surface portions so as to minimize deformation of a pattern-bearing central region of the substrate.

For instance, JP-A 2003-050458 discloses that a substrate is judged on a pass/fail basis by measuring the flatness of the substrate and simulating the shape of a photomask substrate after vacuum chucking. If more substrates fail, the manufacture process suffers from substantial wastes. JP-A 2004-029735 refers to the flatness of a substrate, but not to the chucking in an exposure tool, indicating that the photomask shows an insufficient flatness when mounted in the exposure tool.

WO 2004/083961 proposes a reticle substrate configured to minimize the deformation of the reticle vacuum chucked in an exposure tool wherein the shape of a substrate surface extending to the outermost periphery near the boundary of a chamfered surface is defined. The substrate must be inspected by a probe type topography measuring apparatus in order to confirm the shape outside the range that is measurable by a flatness tester of optical interference type. This means that the substrate after polishing is subject to contact inspection, with an increased risk of damages being caused by handling. Productivity is undesirably low due to an increased number of inspection steps.

CITATION LIST

Patent Document 1: JP-A 2003-050458
Patent Document 2: JP-A 2004-029735
Patent Document 3: WO 2004/083961

SUMMARY OF INVENTION

An object of the invention is to provide a photomask-forming glass substrate including portions of distortion-free shape corresponding to chucking means of an exposure tool, and a method for preparing the same at a high productivity.

With regard to a photomask comprising a square-shaped glass substrate having a pair of major surfaces and a patterned light-shielding film on one surface of the substrate which is held at chucking portions in an exposure tool, the inventors have found that the glass substrate becomes an effective photomask-forming glass substrate suited for the high-definition, high-accuracy photolithography when the following conditions are met. The major surface where the chucking portions are disposed is delineated by four peripheral sides; two strip regions are defined on the major surface near a pair of opposed sides such that each region spans between 2 mm and 10 mm inward of the side and extends parallel to the side, but excludes end portions extending 2 mm inward from the longitudinally opposed ends of the side; and a least squares plane is computed for each of the two strip regions, based on a distance from any common reference plane to a coordinate point within the strip region. The angle included between normal lines to the least squares planes of the two strip regions is less than or equal to 10 seconds. It is assumed that F1 is the least squares plane of one strip region, F2 is the least squares plane of the other strip region, F3 is a least squares plane for a major surface region coextensive with the major surface, excluding peripheral portions extending 2 mm inward from the four sides, but including the two strip regions, a plane F3' parallel to F3 is disposed such that the center of a strip region-equivalent region of F1 and the center of a strip region-equivalent region of F2 may fall on the same side relative to F3', and the strip regions have a height difference represented by the absolute value |D1−D2| of the difference between a distance D1 of a normal line drawn from the center of a strip region-equivalent region of F1 to plane F3' and a distance D2 of a normal line drawn from the center of a strip region-equivalent region of F2 to plane F3'. The height difference between the strip regions is less than or equal to 0.5 μm. The glass substrate meeting the foregoing requirements ensures that when a photomask prepared therefrom is mounted in an exposure tool by a vacuum chuck or holding means, any surface topographic change of the overall photomask by chucking is minimized.

The inventors have also found that the photomask-forming glass substrate is obtainable by computing a least squares plane for each of the regions, and locally removing each region in accordance with a difference between the least squares plane of the region and an actual surface so that the region may become flat; more specifically, by defining two strip regions on the major surface near a pair of opposed sides such that each region spans between 2 mm and 10 mm inward of the side and extends parallel to the side, but excludes end portions extending 2 mm inward from the longitudinally opposed ends of the side, defining a major surface region coextensive with the major surface, excluding peripheral portions extending 2 mm inward from the four sides, but including the two strip regions, computing a least squares plane for the major surface region, based on a distance from any common reference plane to a coordinate point within the region, comparing the least squares plane of the major surface region with an actual surface topography of each of the two strip regions to determine a difference, computing a removal amount at a coordinate point within each strip region in accordance with the difference, and effecting local polishing or etching to remove a surface portion of the substrate in each strip region corresponding to the removal amount. As used herein, the term "topography" is sometimes simply referred to as "shape".

The invention provides a photomask-forming glass substrate and a method for preparing the same, which are defined below.

[1] In connection with a photomask comprising a square-shaped glass substrate having a pair of major surfaces and a patterned light-shielding film on one surface of the substrate which is chucked at chucking portions in an exposure tool, the glass substrate wherein the major surface where the chucking portions are disposed is delineated by four peripheral sides, two strip regions are defined on the major surface near a pair of opposed sides such that each region spans between 2 mm and 10 mm inward of the side and extends parallel to the side, but excludes end portions extending 2 mm inward from the longitudinally opposed ends of the side, a least squares plane is computed for each of the two strip regions, based on a distance from any common reference plane to a coordinate point within the strip region, the angle included between normal lines to the least squares planes of the two strip regions is less than or equal to 10 seconds, on the assumption that F1 is the least squares plane of one strip region, F2 is the least squares plane of the other strip region, F3 is a least squares plane for a major surface region coextensive with the major surface, excluding peripheral portions extending 2 mm inward from the four sides, but including the two strip regions, a plane F3' parallel to F3 is disposed such that the center of a strip region-equivalent region of F1 and the center of a strip region-equivalent region of F2 may fall on the same side relative to F3', and the strip regions have a height difference represented by the absolute value |D1−D2| of the difference between a distance D1 of a normal line drawn from the center of a strip region-equivalent region of F1 to plane F3' and a distance D2 of a normal line drawn from the center of a strip region-equivalent region of F2 to plane F3', the height difference between the strip regions is less than or equal to 0.5 μm.

[2] The glass substrate of [1] wherein both the strip regions have a flatness of less than or equal to 1.0 μm.

[3] The glass substrate of [1] or [2] wherein a central square region coextensive with the major surface and excluding peripheral portions extending 10 mm inward from the four sides has a flatness of less than or equal to 0.5 μm.

[4] The glass substrate of any one of [1] to [3] which is a silica glass substrate having four sides of each 152 mm long and a thickness of 6.35 mm.

[5] A method for preparing a square-shaped glass substrate which is used to form a photomask by forming a patterned light-shielding film on one surface thereof, comprising the steps of:

defining two strip regions on the major surface near a pair of opposed sides such that each region spans between 2 mm and 10 mm inward of the side and extends parallel to the side, but excludes end portions extending 2 mm inward from the longitudinally opposed ends of the side, defining a major surface region coextensive with the major surface, excluding peripheral portions extending 2 mm inward from the four sides, but including the two strip regions, computing a least squares plane for the major surface region, based on a distance from any common reference plane to a coordinate point within the region, comparing the least squares plane of the major surface region with an actual surface topography of each of the two strip regions to determine a difference, computing a removal amount at a coordinate point within each strip region in accordance with the difference, and effecting local polishing or etching to remove a surface portion of the substrate in each strip region corresponding to the removal amount.

[6] The method of [5] wherein the two strip regions are parallel to the least squares plane of the major surface region, a least squares plane is computed for each of the two strip regions, based on a distance from the common reference plane to a coordinate point within the strip region, on the assumption that F1 is the least squares plane of one strip region, F2 is the least squares plane of the other strip region, F3 is a least squares plane for the major surface region, a plane F3' parallel to F3 is disposed such that the center of a strip region-equivalent region of F1 and the center of a strip region-equivalent region of F2 may fall on the same side relative to F3', and the strip regions have a height difference represented by the absolute value |D1−D2| of the difference between a distance D1 of a normal line drawn from the center of a strip region-equivalent region of F1 to plane F3' and a distance D2 of a normal line drawn from the center of a strip region-equivalent region of F2 to plane F3', said method further comprising the steps of:

computing a desired topography of each strip region which ensures that the height difference between the strip regions is equal to zero (0), and determining the difference between the least squares plane of the major surface region and an actual surface topography of each strip region from the difference between the desired topography of each strip region and the actual surface topography of each strip region.

[7] The method of [6] wherein the desired topography of each strip region is the least squares plane of the major surface region.

[8] The method of any one of [5] to [7], further comprising the steps of:

defining a central square region coextensive with the major surface and excluding peripheral portions extending 10 mm inward from the four sides, computing a least squares plane for the central square region, based on a distance from the common reference plane to a coordinate point within the region, comparing the least squares plane of the central square region with an actual surface topography of the central square region to determine a difference, computing a removal amount at a coordinate point within the central square region in accordance with the difference, and effecting local polishing or etching to remove a surface portion of the substrate in the central square region corresponding to the removal amount.

[9] The method of any one of [5] to [8], further comprising the step of double-side polishing after the local polishing or etching step such that both the strip regions have a flatness of less than or equal to 1.0 μm.

[10] The method of any one of [5] to [8], further comprising the step of double-side polishing after the local polishing or local etching such that the central square region has a flatness of less than or equal to 0.5 μm.

[11] The method of any one of [5] to [8], wherein after the local polishing or etching step, a polishing step is performed for improving the surface quality and defective quality of the substrate surface being processed, the polishing step being carried out after previously evaluating a topographic change of the strip regions before and after the polishing step, computing an adjustment removal amount by subtracting an amount corresponding to the topographic change, and effecting local polishing or etching of each strip region, using the adjustment removal amount as the amount of a substrate surface portion to be removed during the local polishing or etching step, thereby removing the substrate surface portion.

[12] The method of any one of [5] to [11], wherein the glass substrate is a silica glass substrate having four sides of each 152 mm long and a thickness of 6.35 mm.

ADVANTAGEOUS EFFECTS OF INVENTION

The invention provides a glass substrate, typically silica glass substrate for forming a photomask used in the photolithography process for the fabrication of ICs and microelectronic devices. When a photomask is mounted in a mask stage of an exposure tool by a vacuum chuck or holding means for exposure purpose, any surface topographic change of the overall photomask by chucking is minimized. The glass substrate can be prepared in a productive manner through steps as employed in the conventional inspection process. Since the flatness of the photomask is not adversely affected by the mounting of the photomask in the exposure tool, a microelectronic fabrication process enabling further miniaturization is expectable.

DESCRIPTION OF EMBODIMENTS

Figure 1A:
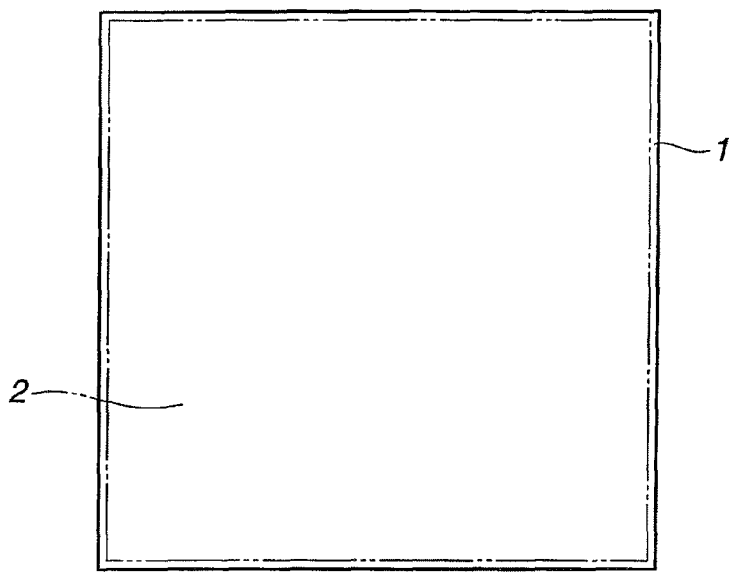
FIG. 1 is a plan view of one major surface of a glass substrate in which relevant regions are defined, FIG. 1A illustrating a major surface region, and FIG. 1B illustrating strip regions and a central square region.
Figure 1B:
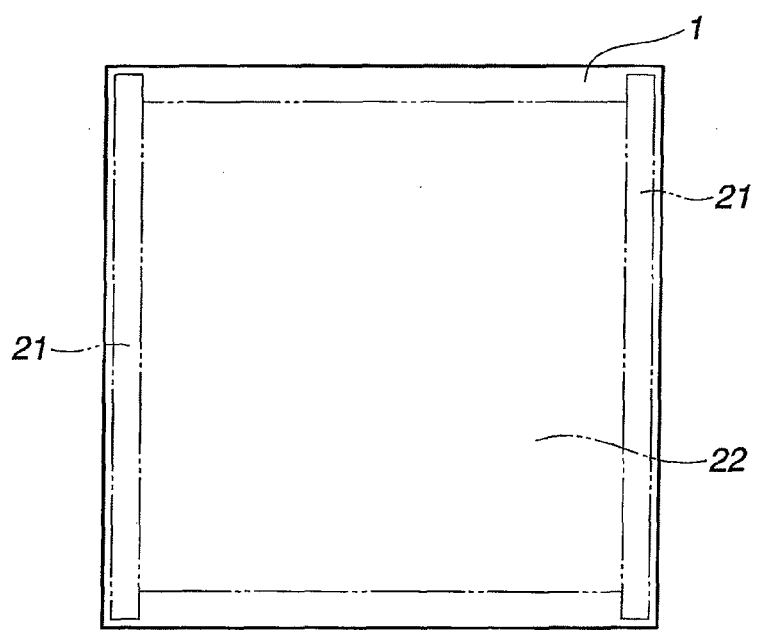

A photomask comprising a square-shaped glass substrate having a pair of major surfaces and a patterned light-shielding film on one surface of the substrate is held at its chucking portions in an exposure tool. The invention pertains to the major surface of the glass substrate where the chucking portions are disposed. The major surface is delineated by four peripheral sides. Now predetermined regions are defined on the major surface including the chucking portions where the photomask is held in the exposure tool. Specifically, as shown in FIG. 1, two strip regions 21 are defined on the major surface 1 near a pair of opposed sides such that each region spans between 2 mm and 10 mm inward of the side and extends parallel to the side, but excludes end portions extending 2 mm inward from the longitudinally opposed ends of the side. An average plane, i.e., least squares plane is computed for each of the two strip regions 21, based on a distance from any common reference plane to a coordinate point within the strip region. The least squares planes of two strip regions 21 are generally parallel and staggered by a step (or height difference) of less than or equal to 0.5 μm.

More specifically, least squares planes are defined for a pair of strip regions 21, respectively. The angle included between normal lines to the least square planes is less than or equal to 10 seconds, so that the exposure surface may be more flat when the photomask is held in the exposure tool. For a pair of strip regions meeting this requirement, it is assumed that F1 is the least squares plane of one strip region, F2 is the least squares plane of the other strip region, F3 is a least squares plane for a major surface region coextensive with the major surface, excluding peripheral portions extending 2 mm inward from the four sides, but including the two strip regions, and a plane F3' parallel to F3 is disposed such that the center of a strip region-equivalent region of F1 and the center of a strip region-equivalent region of F2 may fall on the same side relative to F3'. Then the strip regions have a height difference represented by the absolute value |D1−D2| of the difference between a distance D1 of a normal line drawn from the center of a strip region-equivalent region of F1 to plane F3' and a distance D2 of a normal line drawn from the center of a strip region-equivalent region of F2 to plane F3'. The height difference between the strip regions is less than or equal to 0.5 μm.

The invention is advantageously applicable to the so-called 6-inch substrates dimensioned 152±0.2 mm by 152±0.2 mm by 6.35±0.1 mm. The glass substrate is preferably a silica glass substrate, i.e., quartz glass substrate.

A starting glass substrate, e.g., a glass substrate subject to local polishing or etching is measured for surface topography. Although measurement of a surface topography may be done by any desired techniques, the optical interference type measurement is a preferred example because a high accuracy is desired. In a flatness tester of optical interference type wherein coherent (in phase) light, typically laser light is directed to and reflected by the surface of a substrate which is held vertically upright, a difference in height between substrate surface areas is observable as a phase shift of the reflected light. From this result, the topography of the substrate surface (or of each region) is measurable as a height (Z coordinate) relative to the XY coordinate system of a reference plane having a flatness of 0 μm. From this information, the least squares plane for each region on the substrate surface, the angle and height of a normal line thereto, and the flatness (TIR: total indicator reading) of each region may be computed.

It is noted that a flatness may be measured by an optical interference type flatness tester Tropel UltraFlat® M200 (Corning Tropel Corp.). In particular, Tropel UltraFlat® M200 is characterized by a shallow angle of incident light and a higher sensitivity of interference fringes than a flatness tester FM200 of the earlier generation and ensures that the measurement region is not affected by reflection from the end face even near the end of the surface, that is, a surface topography in a range within 2 mm from the end face is measurable at a high accuracy.

The least squares plane and the flatness (TIR) have been established as the means for evaluating photomask-forming glass substrates and may be computed from coordinate data measured by a flatness tester. Based on the least squares planes of two strip regions measured by a flatness tester, the angle included between normal lines to the two least squares planes may be determined. It is assumed for a pair of strip regions that F1 is the least squares plane of one strip region, F2 is the least squares plane of the other strip region, F3 is a least squares plane for a major surface region coextensive with the major surface, excluding peripheral portions extending 2 mm inward from the four sides, but including the two strip regions, and a plane F3' parallel to F3 is disposed such that the center of a strip region-equivalent region of F1 and the center of a strip region-equivalent region of F2 may fall on the same side relative to F3'. As long as the angle included between normal lines to the two least squares planes is generally within 3600 seconds, the absolute value |D1−D2| of the difference between a distance D1 of a normal line drawn from the center of a strip region-equivalent region of F1 to plane F3' and a distance D2 of a normal line drawn from the center of a strip region-equivalent region of F2 to plane F3' may be defined as the height difference between the strip regions.

The difference in height between a pair of strip regions might be defined by drawing a normal line from the center of a strip region-equivalent region of one least squares plane to the other least squares plane, or drawing a normal line from the center of a strip region-equivalent region of the other least squares plane to one least squares plane, and determining the absolute value of the difference therebetween. In this case, however, even when the angle included between normal lines of the strip regions is 10 seconds, only a difference in height resulting from mutual inclination of the strip regions is 0.67 µm at maximum for a 6-inch square substrate, for example. Thus this definition is undesired.

Figure 2:
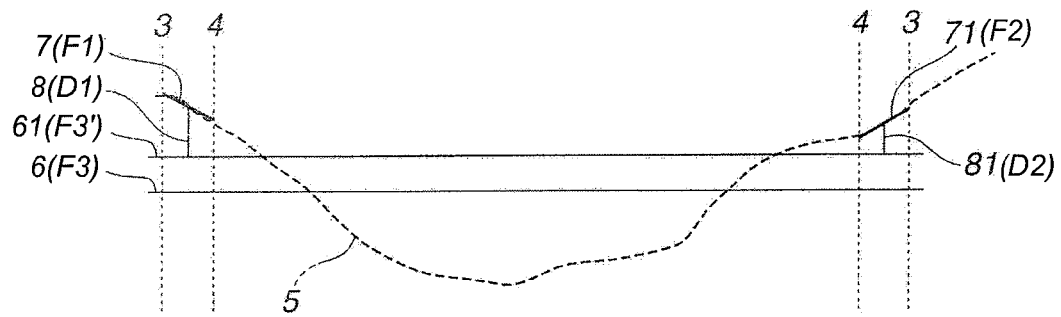
FIG. 2 is an exaggerated schematic view illustrating the definition of the height of strip regions on the glass substrate.

FIG. 2 is a schematic view in cross section of a substrate for illustrating a difference in height between strip regions as defined above. Illustrated in FIG. 2 are a position 3 disposed 2 mm inward from the substrate side (end face), a position 4 disposed 10 mm inward from the substrate side (end face), a substrate surface 5 prior to local polishing or etching, a least squares plane 6 for a major surface region, a plane 61 parallel to the least squares plane 6 for a major surface region, a least squares plane 7 for one strip region, a least squares plane 71 for the other strip region, a normal line 8 drawn from the center of a strip region-equivalent region of the least squares plane of one strip region to a plane parallel to the least squares plane of the major surface region, and a normal line 81 drawn from the center of a strip region-equivalent region of the least squares plane of the other strip region to a plane parallel to the least squares plane of the major surface region.

In a preferred embodiment, the angle included between normal lines to the respective least squares planes of two (paired) strip regions is within 5 seconds. In another preferred embodiment, the step or height difference between two strip regions is less than or equal to 0.25 µm.

In a preferred embodiment, two (paired) strip regions both have a flatness of less than or equal to 1.0 µm, specifically less than or equal to 0.3 µm, and more specifically less than or equal to 0.1 µm. A larger flatness value may cause the substrate to be inclined or deformed in surface topography upon mounting of the photomask in the exposure tool, even if the angle included between normal lines to the least squares planes is within the range.

In a further preferred embodiment, a central square region coextensive with the major surface and excluding peripheral portions extending 10 mm inward from the four sides has a flatness of less than or equal to 0.5 µm, more preferably less than or equal to 0.25 µm.

In the practice of the invention, a photomask-forming glass substrate having the surface topography defined above may be obtained using local etching by a plasma etching technique or local polishing by a small-size rotary machining tool.

The method for processing the substrate surface into the surface topography defined above by local etching or polishing may comprise the steps of:

(1) defining two strip regions on the major surface near a pair of opposed sides such that each region spans between 2 mm and 10 mm inward of the side and extends parallel to the side, but excludes end portions extending 2 mm inward from the longitudinally opposed ends of the side, defining a major surface region coextensive with the major surface, excluding peripheral portions extending 2 mm inward from the four sides, but including the two strip regions, computing a least squares plane for the major surface region, based on a distance from any common reference plane to a coordinate point within the region, comparing the least squares plane of the major surface region with an actual surface topography of each of the two strip regions to determine a difference, computing a removal amount at a coordinate point within each strip region in accordance with the difference, and effecting local polishing or etching to remove a surface portion of the substrate in each strip region corresponding to the removal amount; and optionally, further (2) defining a central square region coextensive with the major surface and excluding peripheral portions extending 10 mm inward from the four sides, computing a least squares plane for the central square region, based on a distance from the common reference plane to a coordinate point within the region, comparing the least squares plane of the central square region with an actual surface topography of the central square region to determine a difference, computing a removal amount at a coordinate point within the central square region in accordance with the difference, and effecting local polishing or etching to remove a surface portion of the substrate in the central square region corresponding to the removal amount. Local etching by a plasma etching technique or local polishing by a small-size rotary machining tool may be performed with method (1) alone or methods (1) and (2) combined. Each of methods (1) and (2) may be performed only one time or two or more times, while methods (1) and (2) may be alternately performed.

The synthetic quartz glass substrate suited as the starting glass substrate in the invention is one which has been prepared from a synthetic quartz glass ingot by shaping, annealing, slicing, lapping, and rough polishing. The synthetic quartz glass substrate which has been flattened to some extent by any conventional well-known polishing technique is preferred.

In order to provide the glass substrate with strip regions of the predetermined or desired topography, preferably with strip regions and a central square region of the predetermined or desired topography, the substrate surface is subjected to local etching by a plasma etching technique or local polishing by a small-size rotary machining tool.

In the embodiment wherein a pair of strip regions are subject to local etching or polishing, the local etching or polishing may be performed by computing a least squares plane for the major surface region based on a distance from any common reference plane to a coordinate point within the region, comparing a plane which is parallel to the least squares plane of the major surface region and below the lowest point within an actual surface topography of each strip region (i.e., strip region-equivalent region within a plane parallel to the least squares plane of the major surface region) with the actual surface topography of each strip region to determine a difference therebetween, computing a removal amount at a coordinate point within the strip region in accordance with the difference, and using the removal amount as the removal amount during the local etching or polishing. In this event, it is preferred that both the two strip regions are parallel to the least squares plane of the major surface region; and for the least squares planes which are computed for the two strip regions, based on a distance from the common reference plane to a coordinate point within the region, the desired topographies of the two strip regions are computed such that the height of the two least square planes (which corresponds to the distance of a normal line drawn from the center of the strip region-equivalent region of the least square plane of one strip region to the least square plane of the other strip region) is 0, and a difference between the desired topography of the strip region and the actual surface topography is determined. In a simplified version, the least squares plane of the major surface region may be applied as the desired topography of the strip region.

Figure 3A:
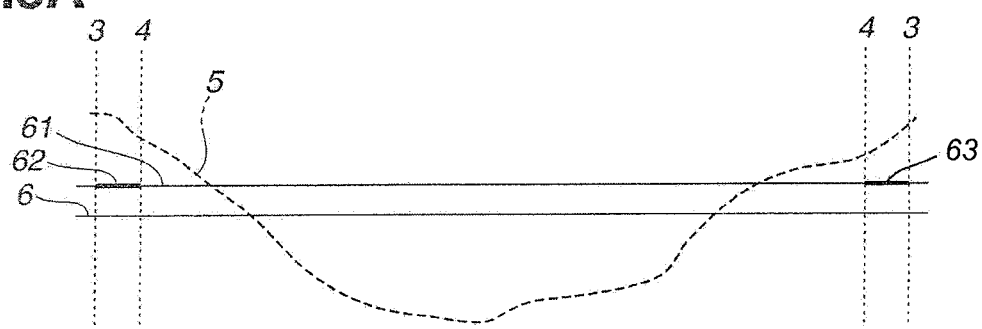
FIG. 3 is an exaggerated schematic view of a cross-sectional profile of an exemplary glass substrate surface before and after processing based on an appropriate removal amount computed, in processing of a pair of strip regions on the glass substrate, FIG. 3A illustrating the profile before removal and FIG. 3B illustrating the profile after removal.
Figure 3B:
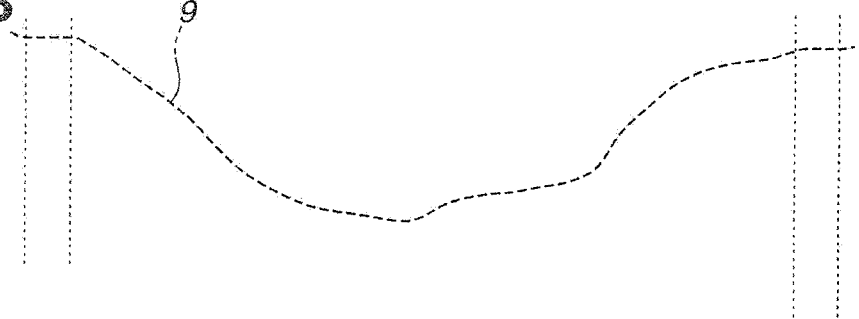

FIG. 3 schematically illustrates in cross section a substrate in which substrate surface portions of two strip regions have been removed in this way. FIG. 3A is the profile prior to removal, and FIG. 3B is the profile after removal. In FIG. 3A, 62 and 63 designate a strip region-equivalent region within a plane parallel to the least squares plane of the major surface region. In FIG. 3B, 9 designates a substrate surface after local polishing or etching. The remaining components are designated by like reference characters as in FIG. 2, and their description is omitted herein. As seen in the cross-sectional profile after removal, the angle included between normal lines to the least squares planes of a pair of strip regions and the height difference between the strip regions are improved, and even the flatness is improved.

Notably, in the embodiment wherein a pair of strip regions are subject to local etching or polishing, it is not recommended that the difference between a plane which is parallel to the least squares plane of each of paired strip regions and below the lowest point within the paired strip regions and the actual surface topography of each of the strip regions is used as the amount of material to be removed during the local etching or polishing. The reason is that if the angle included between normal lines to the least square planes of the paired strip regions prior to removal is significantly different, the angle included between normal lines may not be improved to the desired value after removal.

Figure 4A:
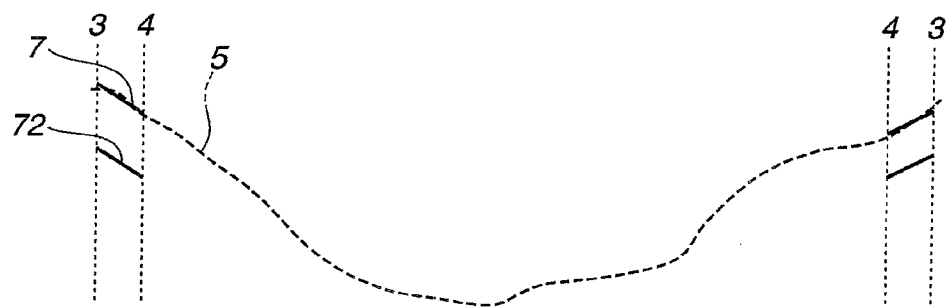
FIG. 4 is an exaggerated schematic view of a cross-sectional profile of an exemplary glass substrate surface before and after processing based on an inappropriate removal amount computed, in processing of a pair of strip regions on the glass substrate, FIG. 4A illustrating the profile before removal and FIG. 4B illustrating the profile after removal.
Figure 4B:
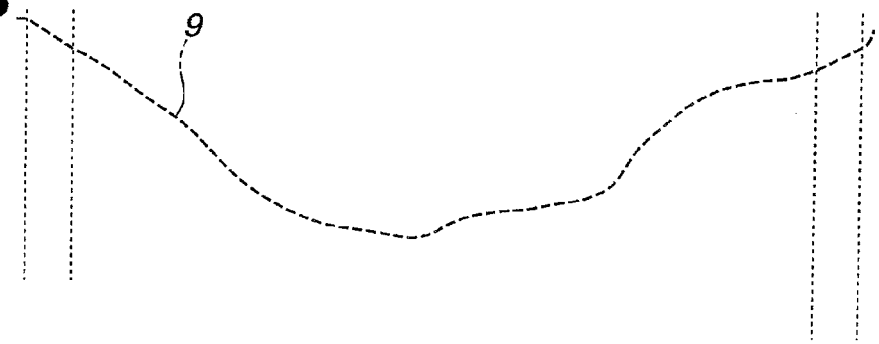

FIG. 4 schematically illustrates in cross section a substrate in which substrate surface portions of two strip regions have been removed in this way. FIG. 4A is the profile prior to removal, and FIG. 4B is the profile after removal. In FIG. 4A, 72 designates a plane parallel to the least squares plane of the strip region. The remaining components are designated by like reference characters as in FIGS. 2 and 3, and their description is omitted herein.

Likewise, in the embodiment wherein the central square region is subject to local etching or polishing, the local etching or polishing may be performed by computing a least squares plane for the central square region, based on a distance from the common reference plane to a coordinate point within the region, comparing the least squares plane of the central square region with an actual surface topography of the central square region to determine a difference, computing a removal amount at a coordinate point within the central square region in accordance with the difference, and using the removal amount as the amount of material to be removed during local polishing or etching.

The removal amount in each region may be assigned to a surface portion of the substrate which is spaced apart from the substrate body when cut by the least squares plane of each region (a portion where an actual surface is convex or protrudent with respect to the least squares plane is relevant). The removal amount may also be assigned to a surface portion of the substrate which is spaced apart from the substrate body when cut by the least squares plane which has been translated to the lowest point of the actual surface (the entire substrate surface excluding the lowest point is relevant).

In the invention, local etching treatment or local polishing treatment is made so that the substrate surface (strip regions and central square region) may take the above-described topography, especially so that the strip regions, preferably the strip regions and central square region may become flatter, and so that a local etching amount or a local polishing amount by a small-size rotary machining tool or the like may be increased or decreased in accordance with the topography of each of the strip regions and central square region, while the etching or polishing amount is locally varied at individual sites on the substrate surface. In this event, if the predetermined topography is not available from single local etching or polishing, for example, the local etching or polishing treatment may be performed plural times or both the treatments be combined. For example, if either one of strip region and central square region fails to take the predetermined topography after the local etching or polishing treatment, then that one region may be subjected again to local etching or polishing treatment. If both regions fail to take the predetermined topography, then both the regions may be subjected again to local etching or polishing treatment.

Specifically, if both of strip region and central square region fail to take the predetermined topography, then local etching treatment by plasma etching or local polishing treatment by a small-size rotary machining tool is preferably carried out by combining methods (1) and (2) whereby substantially the entirety of the substrate surface is subjected to local etching or polishing treatment. Once a surface topography is measured, local etching or polishing treatment is carried out by either one of methods (1) and (2) or a combination thereof. For example, if only the strip region fails to take the predetermined topography after the local etching or polishing treatment, then local etching or polishing is carried out again by method (1). If only the central square region fails to take the predetermined topography after the local etching or polishing treatment, then local etching or polishing is carried out again by method (2). If both fail to take the predetermined topography, then local etching or polishing is carried out again by a combination of methods (1) and (2).

On the other hand, if only the strip region of the starting glass substrate fails to take the predetermined topography, then only method (1) is preferably applied to the first local etching or polishing. If only the central square region of the starting glass substrate fails to take the predetermined topography, then only method (2) is preferably applied to the first local etching or polishing.

In one embodiment of the invention wherein plasma etching is effected in accordance with a removal amount computed for each region on the basis of coordinate data measured by a flatness tester as mentioned above, a plasma-generating housing is placed above the selected surface site to be removed, an etching gas is flowed, and then neutral radicals created within the plasma attack the glass substrate surface in isotropy whereby the attacked area is etched. The portion where the plasma-generating housing is not placed and hence, no plasma is generated is not etched even if the etching gas impinges the portion. This enables local plasma etching.

The moving speed of the plasma-generating housing is determined in accordance with the surface topography of the starting glass substrate. An etching amount may be controlled by controlling the moving speed so as to be slow at the site requiring a large removal amount and to be fast at the site requiring a small removal amount. When the plasma-generating housing is moved on the starting glass substrate, the moving speed of the plasma-generating housing is controlled in accordance with a necessary removal amount on the surface of the starting glass substrate, whereby the substrate can be processed to the desired topography.

It is noted that the method of controlling the moving speed of the plasma-generating housing in accordance with a necessary removal amount of a surface portion of the glass substrate is preferably a computer-aided control method. Since the movement of the plasma-generating housing is relative to the substrate, either the plasma-generating housing or the substrate itself may be moved.

The plasma-generating housing may be based on any desired system, for example, a system wherein a glass substrate is disposed between a pair of electrodes, high-frequency electricity is applied to generate a plasma between the substrate and the electrode, and etching gas is passed through the plasma to create radicals, or a system wherein etching gas is passed through a waveguide tube, microwave is oscillated to generate a plasma, and a stream of radicals thus created is applied to the substrate surface. Either of these systems may be employed.

The etching gas is selected in accordance with the type of glass substrate, and preferably from a halogen compound gas and a gas mixture comprising halogen compounds in the case of a silica glass substrate. Suitable halogen compounds include methane tetrafluoride, methane trifluoride, ethane hexafluoride, propane octafluoride, butane decafluoride, hydrogen fluoride, sulfur hexafluoride, nitrogen trifluoride, carbon tetrachloride, silicon tetrafluoride, methane trifluoride chloride, and boron trichloride. A gas mixture of two or more halogen compounds and a gas mixture of a halogen compound and an inert gas such as argon are also useful.

The surface of the glass substrate as plasma etched may be roughened or include a work damaged layer depending on the plasma etching conditions. If so, polishing may be performed for an extremely short time having no or little substantial impact on the flatness, after the plasma etching. The polishing may be by any well-known polishing techniques such as batchwise rotary double-side polishing and single-wafer rotary single-side polishing.

In the embodiment of the invention wherein local polishing by a small-size rotary machining tool is performed in accordance with the removal amount in each region computed on the basis of coordinate data measured by the flatness tester, once the working (polishing) portion of the small-size rotary machining tool is contacted with the surface of the starting glass substrate, the working portion is rotated and scanned across the surface to perform polishing of the substrate surface. The small-size rotary machining tool may be any desired one as long as its working portion is a rotating member having a polishing ability. Exemplary small-size rotary machining tools include a small-size polishing plate which is placed immediately above the substrate, forced perpendicularly against the substrate under pressure, and rotated about an axis perpendicular to the substrate surface, and a rotary working tool mounted on a small-size grinder wherein the tool is obliquely forced against the substrate under pressure. With respect to the material of the machining tool, at least its working portion comprises green silicon carbide (GC) abrasive, white fused alumina (WA) abrasive, diamond abrasive, cerium abrasive, cerium pad, rubber-bonded compact, felt buff, polyurethane or other materials capable of machining off workpieces. The working portion of the rotary tool may have any desired shape selected from circular or disk, annular, cylinder, cannonball, and barrel shapes.

For machining, the area of contact between the machining tool and the substrate is important. The contact area is specifically 1 to 500 $mm^2$, preferably 2.5 to 100 $mm^2$, and more preferably 5 to 50 $mm^2$. In the event that a protrudent portion is a fine undulation of spatial wavelength, a larger substrate contact area leads to polishing of even a region outside the protrudent portion of interest, failing to eliminate the undulation and causing to disrupt the flatness. In the event that a surface of a substrate near the end is machined, a larger tool is inconvenient in that if the tool is partially moved outside the substrate, the remaining contact portion of the substrate may receive an increased pressure, which makes flat machining difficult. If the contact area is too small, an excess pressure may be applied to cause damages, and the travel distance on the substrate may be increased so that a partial polishing time may become long.

When polishing is performed by bringing the small-size rotary machining tool in contact with a surface portion of protrudent site, this machining is preferably carried out in the co-presence of an abrasive slurry. When the small-size rotary machining tool is moved over the substrate, any one or more of the moving speed, rotational speed and contact pressure of the machining tool may be controlled in accordance with the height of protrusion on the surface of the starting glass substrate. Then, a glass substrate having a high flatness is obtainable.

Suitable abrasive grains include silica, ceria, alundum, white alundum (WA), alumina/zirconia, zirconia, SiC, diamond, titania, and germania. They preferably have a particle size of 10 nm to 10 μm and are typically used as water slurry. The moving speed of the machining tool may vary over a wide range while it is generally selected in a range of 1 to 100 mm/s, but not limited thereto. The working portion of the machining tool is preferably operated at a rotational speed of 100 to 10,000 rpm, more preferably 1,000 to 8,000 rpm, even more preferably 2,000 to 7,000 rpm. A lower rotational speed may lead to a slow machining rate, requiring a longer time until the substrate is machined to completion. A higher rotational speed may lead to a fast machining rate or a more tool wear, making flatness control difficult. Preferably the working portion of the machining tool is contacted with the substrate under a pressure of 1 to 100 $g/mm^2$, more preferably 10 to 100 $g/mm^2$. A lower pressure may lead to a slow machining rate, requiring a longer time until the substrate is machined to completion. A higher pressure may lead to a fast machining rate to make flatness control difficult, and cause noticeable damages when foreign particles are introduced into the tool or slurry.

Figure 5:
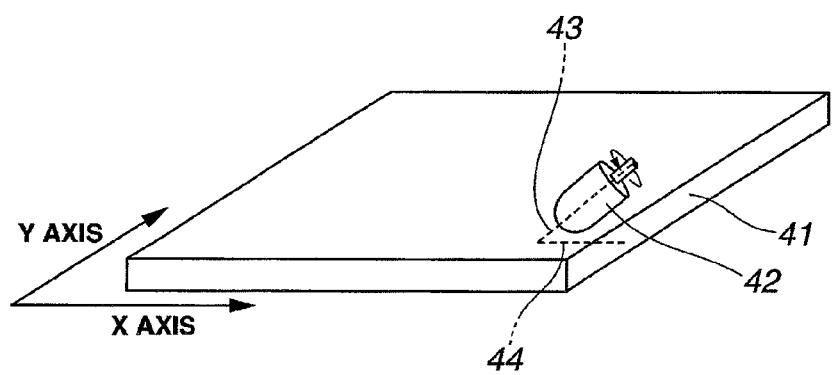
FIG. 5 illustrates one exemplary processing mode using a small-size rotary machining tool.
Figure 6:
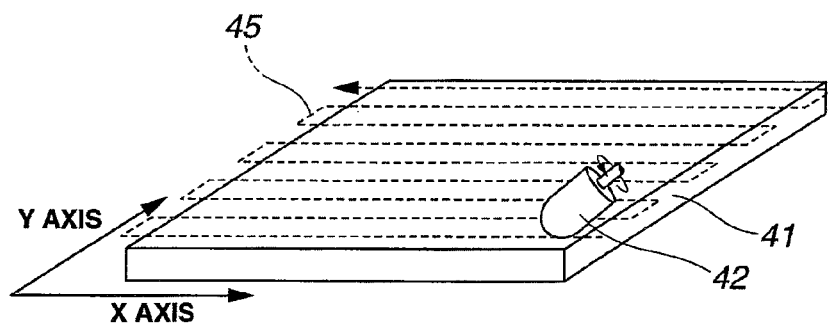
FIG. 6 illustrates another exemplary processing mode using a small-size rotary machining tool.

The control of the moving speed of the partial machining (polishing) tool in accordance with the height of protrusion on the surface of the starting glass substrate may be achieved using a computer. Since the movement of the machining tool is relative to the substrate, the substrate itself may be moved instead. With respect to the moving direction of the machining tool, the structure may be configured to move the tool in any of X and Y directions based on an imaginary XY plane on the substrate surface. This structure will be described with reference to FIGS. 5 and 6. A rotary machining tool 42 is obliquely contacted with a substrate 41. It is assumed that the tool has an axis of rotation 43, and a line or direction 44 of the axis 43 projected on the substrate surface is X axis on the substrate surface. As shown in FIG. 6, the rotary machining tool is scanned forward in X axis direction while its movement in Y axis direction is fixed. At the time when the tool reaches the side end of the substrate, the tool is shifted at a fine pitch 45 in Y axis direction. Again the tool is scanned backward in X axis direction while its movement in Y axis direction is fixed. This scanning operation is repeated until the overall substrate surface is polished. It is preferred that polishing be done while the rotation axis 43 of the rotary machining tool 42 is oblique to a normal to the substrate 41. Specifically the angle of the rotation axis 43 of the tool 42 relative to a normal to the substrate 41 is in a range of 5° to 85°, preferably 10° to 80°, and more preferably 15° to 60°. If this angle is more than 85°, then the contact area becomes larger, and it becomes difficult due to the structure to apply uniform pressure to the entire contact surface and hence to control the flatness. If the angle is less than 5°, then the tool is approximately perpendicular to the substrate, with a likelihood that the profile as machined becomes worsened and overlapping of such profiles at a constant pitch may not result in a flat surface.

The method of contacting the small-size machining tool with the substrate may be a method of adjusting the tool at a height to contact the substrate and operating the tool at the fixed height, or a method of controlling pressure by pneumatic control so as to contact the tool with the substrate. The latter method of contacting the tool with the substrate by maintaining a constant pressure is preferred because the polishing speed becomes constant. The former method of contacting the tool with the substrate by maintaining a constant height sometimes fails in flattening because the working portion of the tool gradually varies in size during machining operation due to wear, and consequently, the contact area or pressure varies to alter the processing rate during machining operation.

With respect to the mechanism of flattening a convex or protrudent portion of the substrate surface in accordance with its height, the above illustrated embodiment is a method of achieving flattening by maintaining constant the rotational speed of the machining tool and the contact pressure of the tool with the substrate surface and changing the moving speed of the tool in a controlled manner. In another embodiment, a method of achieving flattening by changing the rotational speed of the machining tool and the contact pressure of the tool with the substrate surface in a controlled manner.

The substrate as polished above may have a flatness $F_2$ of 0.01 to 0.5 μm, preferably 0.01 to 0.3 μm ($F_1 > F_2$).

After the substrate surface is processed by the machining tool, single-substrate polishing or double-side polishing may be performed to improve the surface quality and defective quality of the final finished surface. In the embodiment wherein the finish polishing step is performed, after the processing of the substrate surface by the machining tool, for the purpose of improving the surface quality and defective quality of the machined surface, the preferred procedure is as follows. A removal amount to be polished by a small-size rotary machining tool is previously determined by taking into account a shape change resulting from the finish polishing step, polishing by the machining tool is done in the predetermined removal amount, and the finish polishing step is then performed. Then the finally finished surface may be provided with the desired topography and high surface completeness at the same time.

More particularly, the surface of the glass substrate as processed above may sometimes be roughened or include a work affected layer, depending on partial polishing conditions even when a soft machining tool is used. In such a case, very brief polishing may be effected to such an extent as to have no substantial impact on the flatness after partial polishing.

Use of a hard machining tool, on the other hand, may sometimes lead to a relatively high degree of surface roughening or a work affected layer of substantial depth. In such a case, it may be effective to predict how the surface shape changes in accordance with polishing parameters of the subsequent finish polishing and to control the shape of partial polishing so as to offset the change. For example, if it is predicted that the overall substrate becomes convex or protrudent by the subsequent finish polishing step, the partial polishing step is controlled so as to previously finish to a concave shape. Then the substrate surface may be finished to the desired shape by the subsequent finish polishing step.

Changes of surface shape which would be induced by the subsequent finish polishing step, for example, the polishing step for improving the surface quality and defective quality of the machined surface, are previously evaluated by providing a preliminary substrate, and measuring the surface shape of the preliminary substrate before and after finish polishing step, using a surface topography measuring apparatus. Based on the data, it is analyzed by a computer how the shape changes. Then the target shape is a shape having added a shape change inverse to the shape change of the finish polishing step. Removal of a surface portion of the substrate by local polishing or etching is carried out in a controlled manner so that the glass substrate may have the target shape. Then the final finished surface becomes closer to the desired shape.

For example, as long as the strip region is concerned, the method may involve computing an adjustment removal quantity from which an amount corresponding to a topographic (shape) change of the finish polishing step has been subtracted, removing a substrate surface portion using this adjustment removal quantity as the removal amount of a substrate surface portion during local polishing or etching of the strip region, and thereafter, performing the finish polishing step.

The finish polishing step following the local polishing or etching step may preferably be double-side polishing. At the end of this polishing step, both the two strip regions preferably have a flatness of less than or equal to 1.0 μm, and the central square region preferably has a flatness of less than or equal to 0.5 μm.

The glass substrate thus obtained is used, for example, in the manufacture of a photomask blank by depositing a light-shielding film of chromium or the like on the glass substrate. The photomask blank is then processed by coating a resist on the light-shielding film, printing a desired pattern in the resist using electron beam or the like, developing the resist film, and etching the light-shielding film through the resist pattern. This results in a photomask having light-transmitting areas and light-shielding areas defined therein. The photomask is mounted in an exposure tool or stepper where a resist film coated on a silicon wafer is exposed imagewise. Subsequent processing in a standard way completes fabrication of a semiconductor device. The photomask manufactured using the glass substrate of the invention has the advantage that when held in the exposure tool by a vacuum chuck or holding means, the photomask undergoes a minimal change of its overall surface topography and maintains a high flatness.

As described above, after the glass substrate is subjected to local etching or local polishing by a small-size machining tool, a photomask blank is manufactured by depositing a light-shielding film of chromium or the like thereon. At this point, the surface shape of the glass substrate may be altered by the stress in the light-shielding film of chromium or the like. In such a case, by predicting how the surface shape changes by the film stress, and controlling the shape after local etching or local polishing by a small-size machining tool to a shape offsetting the change, a photomask blank whose surface shape is the desired shape may be manufactured.

EXAMPLE

Examples of the invention are given below by way of illustration and not by way of limitation.

Example 1

A quartz substrate having a square major surface of 152 mm by 152 mm and a thickness of 6.4 mm was prepared. The surface of this quartz substrate was first measured by a flatness tester of optical interference type, finding that the angle included between normal lines to the least squares planes of a pair of strip regions was 19.62 seconds and the height difference between the two strip regions was 0.87 μm. It is now assumed for a pair of strip regions that F1 is the least squares plane of one strip region, F2 is the least squares plane of the other strip region, F3 is a least squares plane for a major surface region coextensive with the major surface, excluding peripheral portions extending 2 mm inward from the four sides, but including the two strip regions, and a plane F3' parallel to F3 is disposed such that the center of a strip region-equivalent region of F1 and the center of a strip region-equivalent region of F2 may fall on the same side relative to F3'. Then the height difference between the two strip regions is represented by the absolute value |D1−D2| of the difference between a distance D1 of a normal line drawn from the center of a strip region-equivalent region of F1 to plane F3' and a distance D2 of a normal line drawn from the center of a strip region-equivalent region of F2 to plane F3'. A center square region had a flatness of 0.338 μm.

Plasma etching was performed on the strip regions after computing a difference between the least squares plane of the major surface region inclusive of strip regions and an actual surface of each strip region and determining a necessary removal amount from the difference.

A plasma-generating housing of high frequency operation (150 W) having a cylindrical electrode of 75 mm diameter was used. Sulfur hexafluoride was used as the etching gas and fed at a flow rate of 100 sccm. The plasma-generating nozzle was spaced a distance of 2.5 cm from the glass substrate. The processing speed under these conditions was previously measured to be 3.2 mm/min. The moving speed of the nozzle was 20 mm/sec at a substrate portion corresponding to the lowest profile of the substrate. The moving speed of the nozzle across a certain substrate portion was obtained by determining a necessary residence time of the nozzle in that substrate portion and computing a speed therefrom. Treatment was done by moving the nozzle at the computed speed.

After the plasma etching, the substrate surface was measured again by the flatness tester of optical interference type. The angle included between normal lines to the least squares planes of two strip regions was 4.23 seconds, the height difference between the two strip regions was 0.13 μm, and the center square region had a flatness of 0.312 μm.

Example 2

A quartz substrate having a square major surface of 152 mm by 152 mm and a thickness of 6.4 mm was prepared. The surface of this quartz substrate was first measured by a flatness tester of optical interference type, finding that the angle included between normal lines to the least squares planes of a pair of strip regions was 38.44 seconds and the height difference between the two strip regions was 0.74 μm. The height difference between the two strip regions is represented by the absolute value |D1−D2| as in Example 1. A center square region had a flatness of 0.542 μm.

Plasma etching was performed on the strip regions after computing a difference between the least squares plane of the major surface region inclusive of strip regions and an actual surface of each strip region and determining a necessary removal amount from the difference. Plasma etching was also performed on the central square region after computing a difference between the least squares plane of the central square region and an actual surface of the central square region and determining a necessary removal amount from the difference.

A plasma-generating housing of high frequency operation (150 W) having a cylindrical electrode of 75 mm diameter was used. Sulfur hexafluoride was used as the etching gas and fed at a flow rate of 100 sccm. The plasma-generating nozzle was spaced a distance of 2.5 cm from the glass substrate. The processing speed under these conditions was previously measured to be 3.2 mm/min. The moving speed of the nozzle was 20 mm/sec at a substrate portion corresponding to the lowest profile of the substrate. The moving speed of the nozzle across a certain substrate portion was obtained by determining a necessary residence time of the nozzle in that substrate portion and computing a speed therefrom. Treatment was done by moving the nozzle at the computed speed.

After the plasma etching, the substrate surface was measured again by the flatness tester of optical interference type. The angle included between normal lines to the least squares planes of two strip regions was 13.75 seconds, the height difference between the two strip regions was 0.17 μm, and the center square region had a flatness of 0.040 μm.

Since the angle included between normal lines to the least squares planes of two strip regions did not fall in the desired range, plasma etching was performed again on the strip regions after computing a difference between the least squares plane of the major surface region inclusive of plasma etched strip regions and an actual surface of each strip region and determining a necessary removal amount from the difference.

Thereafter, the substrate surface was measured again by the flatness tester of optical interference type. The angle included between normal lines to the least squares planes of two strip regions was 2.11 seconds, the height difference between the two strip regions was 0.11 μm, and the center square region had a flatness of 0.026 μm.

Example 3

A quartz substrate having a square major surface of 152 mm by 152 mm and a thickness of 6.4 mm was prepared. The surface of this quartz substrate was first measured by a flatness tester of optical interference type, finding that the angle included between normal lines to the least squares planes of a pair of strip regions was 51.63 seconds and the height difference between the two strip regions was 1.48 µm. The height difference between the two strip regions is represented by the absolute value |D1−D2| as in Example 1. A center square region had a flatness of 1.467 µm.

Plasma etching was performed on the strip regions after computing a difference between the least squares plane of the major surface region inclusive of strip regions and an actual surface of each strip region and determining a necessary removal amount from the difference. Plasma etching was also performed on the central square region after computing a difference between the least squares plane of the central square region and an actual surface of the central square region and determining a necessary removal amount from the difference.

A plasma-generating housing of high frequency operation (150 W) having a cylindrical electrode of 75 mm diameter was used. Sulfur hexafluoride was used as the etching gas and fed at a flow rate of 100 sccm. The plasma-generating nozzle was spaced a distance of 2.5 cm from the glass substrate. The processing speed under these conditions was previously measured to be 3.2 mm/min. The moving speed of the nozzle was 20 mm/sec at a substrate portion corresponding to the lowest profile of the substrate. The moving speed of the nozzle across a certain substrate portion was obtained by determining a necessary residence time of the nozzle in that substrate portion and computing a speed therefrom. Treatment was done by moving the nozzle at the computed speed.

After the plasma etching, the substrate surface was measured again by the flatness tester of optical interference type. The angle included between normal lines to the least squares planes of two strip regions was 12.05 seconds, the height difference between the two strip regions was 0.41 µm, and the center square region had a flatness of 0.561 µm.

Since both the angle included between normal lines to the least squares planes of two strip regions and the flatness of the center square region did not fall in the desired ranges, plasma etching was performed again on the strip regions after computing a difference between the least squares plane of the major surface region inclusive of plasma etched strip regions and an actual surface of each strip region and determining a necessary removal amount from the difference. Plasma etching was also performed on the central square region after computing a difference between the least squares plane of the central square region and an actual surface of the central square region and determining a necessary removal amount from the difference.

Thereafter, the substrate surface was measured again by the flatness tester of optical interference type. The angle included between normal lines to the least squares planes of two strip regions was 1.94 seconds, the height difference between the two strip regions was 0.11 µm, and the center square region had a flatness of 0.031 µm.

Example 4

A quartz substrate having a square major surface of 152 mm by 152 mm and a thickness of 6.4 mm was prepared. The surface of this quartz substrate was first measured by a flatness tester of optical interference type, finding that the angle included between normal lines to the least squares planes of a pair of strip regions was 25.45 seconds and the height difference between the two strip regions was 0.87 µm. The height difference between the two strip regions is represented by the absolute value |D1−D2| as in Example 1. A center square region had a flatness of 0.338 µm.

Polishing was performed on the strip regions after computing a difference between the least squares plane of the major surface region inclusive of strip regions and an actual surface of each strip region and determining a necessary removal amount from the difference.

A local polishing apparatus was used comprising a motor, a small-size rotary machining tool mounted on the motor for rotation, and a pneumatic means for forcing the machining tool. The motor was commercially available as a micro-motor grinder consisting of a motor unit EPM-120 and a power unit LPC-120 from Nihon Seimitu Kikai Kosaku Co., Ltd. The machining tool was commercially available as a cannonball-shaped felt buff F3620 of 20 mm diameter by 25 mm from Nihon Seimitu Kikai Kosaku Co., Ltd. The setup was such that the machining tool was obliquely contacted with the substrate surface at an angle of about 50° over a contact area of 5.0 mm².

The substrate was processed over the entire surface by operating the machining tool at a rotational speed of 4,000 rpm and a pressure of 30 g/mm², and traversing the tool across the workpiece. As shown by the arrow in FIG. 6, machining was performed by continuously moving the machining tool parallel to X axis, with a shifting pitch of 0.5 mm in Y axis direction. The processing speed under these conditions was previously measured to be 1.1 mm/min. The moving speed of the machining tool was 50 mm/sec at a substrate portion corresponding to the lowest profile of the substrate. The moving speed of the tool across a certain substrate portion was obtained by determining a necessary residence time of the tool in that substrate portion and computing a speed therefrom. Treatment was done by moving the tool at the computed speed.

After the partial polishing, the substrate surface was measured again by the flatness tester of optical interference type. The angle included between normal lines to the least squares planes of two strip regions was 3.72 seconds, the height difference between the two strip regions was 0.14 µm, and the center square region had a flatness of 0.072 µm.

Example 5

Ten substrates prepared by the same method as in Example 4 were used as preliminary substrates. A surface topography of each of 10 substrates was measured by a flatness tester of optical interference type. The substrates were subjected to a final polishing step (double-side polishing) using a soft suede-type polishing pad and colloidal silica. After the final polishing, a surface topography of each substrate was measured. A shape (topographic) change by the final polishing step was evaluated by subtracting the height data of the surface topography of each substrate prior to the final polishing step from the height data of the surface topography after the final polishing step to determine a difference, and averaging the difference for 10 substrates. While the final polishing step using a soft suede-type polishing pad and colloidal silica tended to convert the substrate surface shape to a convex one, the shape change was a convex shape of 0.134 µm.

Separately, a quartz substrate having a square major surface of 152 mm by 152 mm and a thickness of 6.4 mm was prepared. The surface of this quartz substrate was first measured by a flatness tester of optical interference type, finding that the angle included between normal lines to the least squares planes of a pair of strip regions was 33.13 seconds and the height difference between the two strip regions was 0.47 µm. The height difference between the two strip regions is represented by the absolute value |D1−D2| as in Example 1. A center square region had a flatness of 0.345 µm.

Next, in order to offset a convex shape of 0.134 µm estimated as the shape change during the final polishing step, a concave shape of 0.134 µm which is an inverse of a convex shape of 0.134 µm was added as the estimated shape change during the final polishing step to partial polishing conditions. Under these conditions, partial polishing by the small-size rotary machining tool as in Example 4 was carried out so as to achieve the concave shape. After the partial polishing, the substrate surface was measured again by the flatness tester of optical interference type. The angle included between normal lines to the least squares planes of two strip regions was 8.15 seconds, the height difference between the two strip regions was 0.41 µm, and the center square region had a flatness of 0.102 µm.

Next, the final polishing step was carried out under the conditions employed for the preliminary substrates. After the final polishing and subsequent cleaning and drying, the substrate surface was measured by the flatness tester of optical interference type, finding that the angle included between normal lines to the least squares planes of two strip regions was 1.26 seconds, the height difference between the two strip regions was 0.14 µm, and the center square region had a flatness of 0.057 µm. The number of defects on an order of 50 nm was 22.

Japanese Patent Application No. 2009-281698 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A square-shaped glass substrate for a photomask, the glass substrate having a pair of major surfaces and a patterned light-shielding film on one surface of the substrate which is chucked at chucking portions in an exposure tool, wherein the major surface where the chucking portions are disposed is delineated by four peripheral sides, two strip regions are defined on the major surface near a pair of opposed sides such that each region spans between 2 mm and 10 mm inward of the side and extends parallel to the side, but excludes end portions extending 2 mm inward from the longitudinally opposed ends of the side, a least squares plane is computed for each of the two strip regions, based on a distance from any common reference plane to a coordinate point within the strip region, the angle included between normal lines to the two least squares planes of the two strip regions is less than or equal to 10 seconds, on the assumption that F1 is the least squares plane of one strip region, F2 is the least squares plane of the other strip region, F3 is a least squares plane for a major surface region coextensive with the major surface, excluding peripheral portions extending 2 mm inward from the four sides, but including the two strip regions, a plane F3' parallel to F3 is disposed such that the center of a strip region-equivalent region of F1 and the center of a strip region-equivalent region of F2 may fall on the same side relative to F3', and the two strip regions have a height difference represented by the absolute value |D1−D2| of the difference between a distance D1 of a normal line drawn from the center of a strip region-equivalent region of F1 to plane F3' and a distance D2 of a normal line drawn from the center of a strip region-equivalent region of F2 to plane F3', and the height difference between the two strip regions is less than or equal to 0.5 µm.

2. The glass substrate of claim 1 wherein both the strip regions have a flatness of less than or equal to 1.0 µm.

3. The glass substrate of claim 1 wherein a central square region coextensive with the major surface and excluding peripheral portions extending 10 mm inward from the four sides has a flatness of less than or equal to 0.5 µm.

4. The glass substrate of claim 1 which is a silica glass substrate having four sides of each 152 mm long and a thickness of 6.35 mm.

* * * * *